United States Patent [19]

Besen et al.

[11] 4,393,277

[45] Jul. 12, 1983

[54] REMOTE TUNER CONTROL SYSTEM

[75] Inventors: Peter D. Besen; Don H. Shulsinger, both of Arlington, Mass.; Stuart D. Goldberg, New York, N.Y.

[73] Assignee: Selectastation, Inc., New York, N.Y.

[21] Appl. No.: 245,138

[22] Filed: Mar. 18, 1981

[51] Int. Cl.³ .......................................... H04M 11/00
[52] U.S. Cl. ................................ 179/2 A; 179/1 SM; 334/8
[58] Field of Search ............... 179/2 A, 2 AM, 1 SM; 334/8-10; 455/151-153, 352-354, 38, 77, 355

[56] References Cited

U.S. PATENT DOCUMENTS

| | | | |
|---|---|---|---|
| 2,886,758 | 5/1959 | Lehman et al. | 339/9 X |
| 3,829,616 | 8/1974 | Blouch | 179/2 A |
| 3,904,967 | 9/1975 | Okada et al. | 334/9 X |

Primary Examiner—G. Z. Rubinson
Assistant Examiner—W. J. Brady
Attorney, Agent, or Firm—Gipple & Hale

[57] ABSTRACT

A remote tuner control system for responding to command signals transmitted by a user on a full-duplex communication channel. The tuner control system comprises a tone decoder coupled to the communication channel for conversion of pushbutton telephone tones generated by a user to binary numeric data; a tuner for reception of local audio broadcast radio signals; a speech generator for generating audio speech command menus and command acknowledgements; an output selector assembly coupled to the tuner and to the speech generator adapted for selection of audio information returned to the user; and an input/output interface assembly coupled to the tuner and output selector assembly. The input/output interface assembly is adapted to control reception frequency of the tuner and output selection of the output selector assembly and is coupled to a processor, the speech generator and tone decoder. The processor is adapted to receive the binary numeric data from the tone decoder and control the input/output interface assembly and speech generator in response to the binary numeric data from the tone decoder.

15 Claims, 5 Drawing Figures

REMOTE TUNER CONTROL SYSTEM

BACKGROUND OF THE INVENTION

This invention relates to a broadcast radio tuner and, more specifically, to a remote tuner control system with artificial voice menu and response features.

In the field of broadcast radio communications, there are many occasions when a person outside of the reception area of a given broadcast radio station has reason to monitor the station's signal. As one example, it is common for an individual or corporate owner of a radio station to be located in a city some distance from the station. The owner may desire to listen to the performance of the owned station from time to time in order to determine whether the station is adhering to operational policies established by the owner. Likewise, the absentee owner of a competing station in the same market may desire to monitor the competition in order to refine operation and marketing strategies.

Other persons may also wish to monitor the performance of a given station. Advertisers frequently contract with stations or networks of stations for advertising to be run at specific times during the day. Advertising agencies therefore monitor radio station performance to determine whether or not the station has in fact fulfilled its contractual obligation. Regulatory agencies such as the Federal Communications Commission may also wish to monitor the performance of radio stations in order to enforce statutory and regulatory obligations. In the case of stations which broadcast copyrighted entertainment material under licence, licensing organizations such as the American Society of Composers, Authors and Publishers (ASCAP) and Broadcast Music Inc. (BMI) may wish to monitor stations in order to determine copyright royalty fees. In the case of a station which is known in the broadcast industry to have an innovative and successful format, program directors of stations in other markets may wish to monitor the innovative format in order to imitate it in their own markets.

Heretofore, those who desired to monitor a station in a remote location have been limited to means which involve either a high capital outlay or a delayed retransmission. The Federal Communications Commision, for instance, often relies on oversized antennas in combination with sensitive tuners and powerful amplifiers to monitor stations from points far beyond their normal service areas. Absentee owners may purchase dedicated phone lines at high cost between the station transmitter and the ownership offices. Others may simply call the station to be monitored and ask for a temporary telephone connection or may hire persons within the station's service area to tape broadcasts for later review.

U.S. Pat. No. 3,693,090 discloses a two-way cable television distribution system. The viewer selects a program to be viewed and the selection is transmitted upstream as a series of tones on two dedicated wires. At the distribution point, the tones are decoded and the resulting selection drives an electromagnetic switching system. The switching system makes contact with a video program source corresponding to the selection transmitted and the program is returned downstream to the user's video receiver via a second high-bandwidth pair of wires.

U.S. Pat. No. 4,197,498 discloses a hand-held radio transceiver microphone and control unit. The hand-held unit includes a single-pole double-throw switch which drives an up/down counter to increment or decrement the channel selected, which in turn is displayed on a segment display of the transceiver unit. The channel selection is decoded by a decoder and digital switch and provided by dedicated line to the transceiver section. The same dedicated line is also used to transmit the status of a transmit/receive switch, squelch control and volume control.

U.S. Pat. No. 4,025,851 discloses a broadcast program monitoring and recording system. This device may be coupled to a home video receiver for ratings purposes or may be coupled to a dedicated receiver for the purposes of monitoring the performance of a particular television broadcasting facility. The system includes a detector for decoding identification codes transmitted as a part of the broadcast signal, as well as a local computer and clock for recording the time at which each program appears on the video receiver. The system may be interrogated intermittently by a remote computer through a telephone line. Thus, a remote office is able to access the viewing record of the program schedule of a particular station.

U.S. Pat. No. 4,122,304 discloses a radiotelephone with autodial capabilities. The system includes a handset with push-button pads and telephone number display controlled by a microcomputer. The handset is linked by cable to a cradle which includes a variety of control switches as well as a channel and status display driven by a second microcomputer. The microcomputer controls the transmission and reception of audio information through a transceiver. The system may include temporary memory for autodial of a number which has previously rung busy, as well as permanent memory for frequently dialed numbers.

In addition to the patents cited above, the following U.S. Pat. Nos. are also of interest: 3,699,443; 3,757,225; 3,774,114; 3,911,204; 4,019,142; and 4,197,497.

The prior art reveals several deficiencies addressed by the present invention. Each system requires some form of customized program or channel selection hardware in the hands of the user. The system designed to communicate with human users has some form of visual feedback, either in the form of a numeric channel selection display, or a television display of the program currently offered on the channel selected. While program image display is often sufficient to determine that the television channel selected is indeed returned to the user, radio stations often duplicate one another's program material to the extent that it is difficult upon listening to determine immediately which station has been selected. Moreover, the systems which offer video monitoring must necessarily make use of dedicated lines providing bandwidth far in excess of that necessary for radio monitoring.

SUMMARY OF THE INVENTION

The present invention overcomes the deficiencies in the prior art by providing a remote-controlled tuner which may be placed in any given locality and interfaced with the telephone network for access and tuning by authorized users over a telephone line. The system will accept commands which the user may transmit by pressing the button of a conventional pushbutton telephone set, and the system may provide to the user both a menu of commands and an acknowledgement of each command received via synthetic voice. The system will also control a tuner so that the station commanded by the user is received and its signal transferred through the telephone line to the user.

Thus, the system provides the capability of remote monitoring of radio stations throughout the effective reach of the telephone network which presently extends well beyond our national borders. Since the telephone network provides adequate bandwidth for radio retransmission, the present invention avoids the substantial capital cost of establishing dedicated telephone lines, and it provides the additional advantage of real time retransmission as opposed to tape delay. Moreover, the command tone decoding and synthetic voice feedback features of the present invention enable the use of conventional pushbutton telephone sets as the means of communication with the system, thereby avoiding the cost of developing and manufacturing a relatively small number of customized user terminals.

As a stand alone system, the present invention may also find use as a personal radio receiver for blind persons. Since conventional tuners provide feedback primarily through a visual tuning scale or light emitting diode segmented digital display, a blind person faces the same lack of feedback as any person attempting to communicate with a conventional tuner over a telephone line. The synthetic voice feedback features and the use of a familiar pushbutton keyboard in the present invention overcomes these disadvantages.

These and other objects and advantages of the present invention will become more readily apparent when read in conjunction with the following detailed description of the present invention, accompanied by reference to the drawings.

DETAILED DESCRIPTION OF THE DRAWINGS

Figure 1:
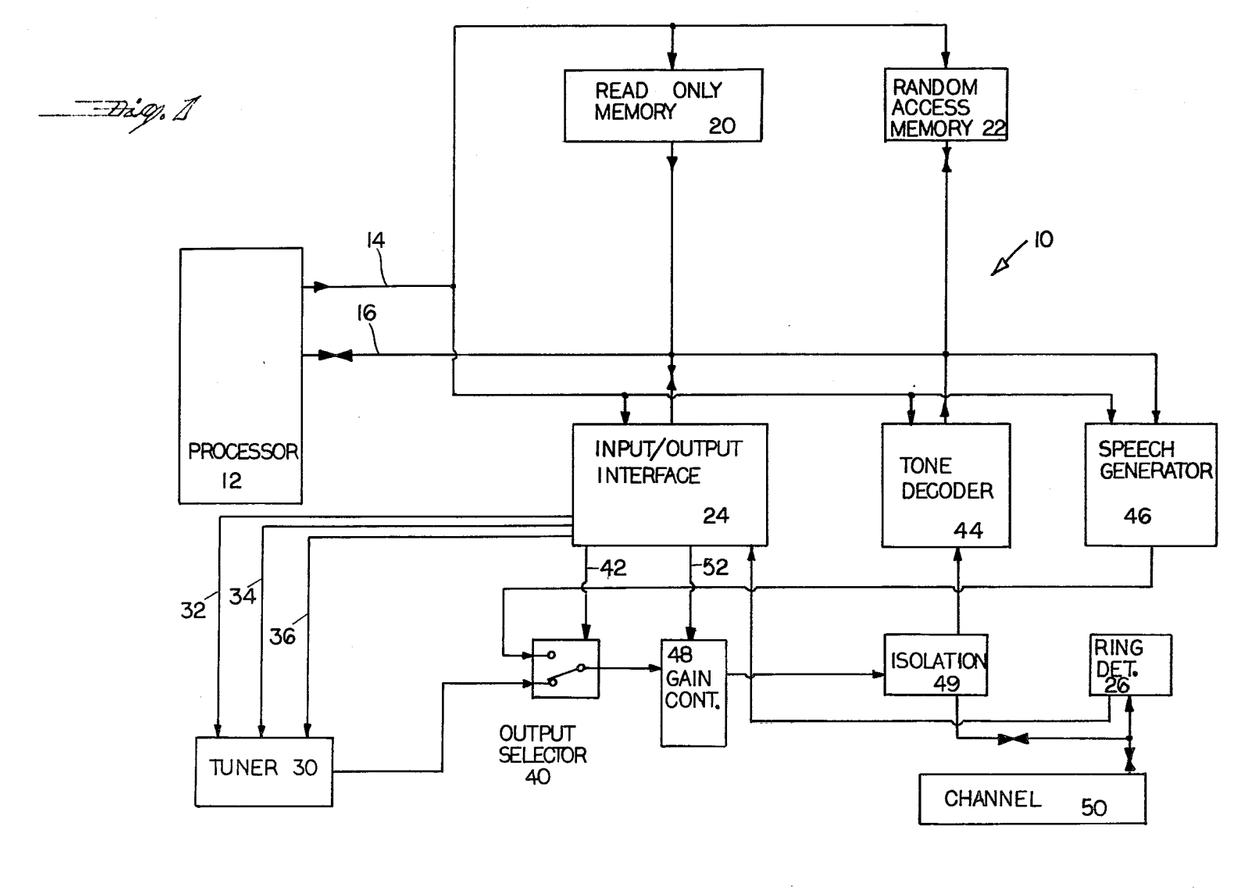
FIG. 1 is a block diagram of a control system which may be constructed according to the present invention.

The best mode and preferred embodiment of the present invention is illustrated in FIG. 1 in which a remote tuner control system is generally indicated at 10. The system 10 includes a programmable processor 12 which may be any conventional microprocessor. The processor 12 utilizes a bi-directional data bus 16 to exchange data with memory devices and input-output devices. The processor 12 also utilizes an address bus 14 to select which of the memory devices or input-output devices will be allowed to communicate with the processor 12 via data bus 16.

Fixed data and program statements may be stored in read-only memory 20, which is coupled to processor 12 via address bus 14 and data bus 16. Random access memory 22 is likewise coupled to processor 12 through the address bus 14 and data bus 16, and may be used for temporary data storage during active operation of the system as set forth hereinbelow. The use of read-only memory 20 allows preservation of program and data during accidental loss of power to system 10, and allows quick and easy updating of fixed data by physical exchange of integrated circuit memory devices.

Channel 50 is a full-duplex communications channel having bandwidth sufficient to provide reasonable audio fidelity for audio signals as well as communication of pushbutton-generated telephone tones. At present, the standard telephone channel has a bandwidth of about 3600 Hz which is adequate for these purposes. The channel 50 is coupled to ring detector 26 and to isolation 49. Ring detector 26 detects a ring signal on channel 50 which indicates that a user requests connection with system 10. The output of ring detector 26 is coupled through input/output interface 24 to processor 12. Isolation 49 provides the incoming tones from channel 50 to tone decoder 44 which is coupled through address bus 14 and data bus 16 to processor 12. Tone decoder 44 decodes the tone received through channel 50 through the user's pushbutton telephone to a numeric value corresponding to the face of the depressed pushbutton.

Interface 24 provides control signals to AM/FM tuner in response to commands provided by the user through channel 50. Band select line 32 controls the selection of either AM or FM reception bands by tuner 30. Line 34 directs tuner 30 to increase the current reception frequency, and line 36 directs the tuner 30 to decrease the current reception frequency. If neither or both of lines 34 and 36 are active, then the reception frequency is held constant. The output of tuner 30 is coupled to one input of output selector 40. The output of speech generator 46 is coupled to a second input of output selector 40, and command line 42 from interface 24 selects which of the inputs will be routed by output selector 40 through gain control 48 and isolation 49 to the channel 50. Command line 52 from interface 24 controls the audio output level of gain control 48. Thus, system 10 may provide speech for menu presentations or command acknowledgement through channel 50 to the user, or it may provide audio output from tuner 30.

Figure 2:
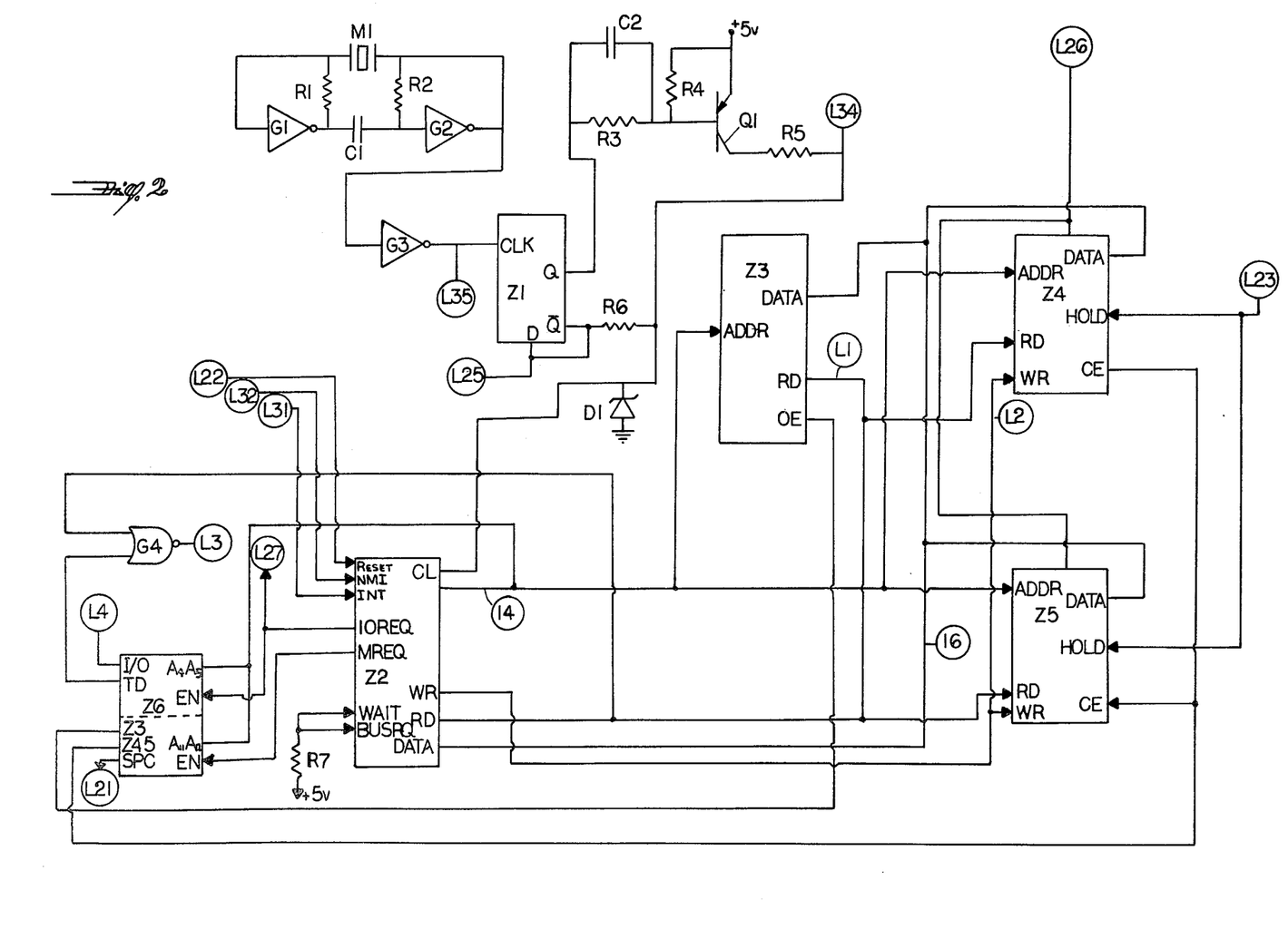
FIG. 2 is a circuit diagram of a circuit corresponding to the processor and memory portions of the block diagram of FIG. 1.

Turning to FIG. 2, there is shown a circuit corresponding to the processor 12, read-only memory 20, and random access memory 22 illustrated in the block diagram of FIG. 1. One electrode of a crystal M1 is coupled to the input of inverter G1, and also through resistor R1 to the output of G1. The other electrode of crystal M1 is coupled through resistor R2 to the input of inverter G2, and also to the output of inverter G2. The output of G1 is also coupled to the input of G2 through capacitor C1. The output of G2 is coupled through inverter G3 and line L35 to the clock input of flipflop Z1. Z1 is a Type D positive-edge-triggered flipflop with both preset and clear inputs tied to a five volt source. The Q output of Z1 is coupled through a resistor R3 and capacitor C2 in parallel to the base of transistor Q1. The base of transistor Q1 is also coupled to the emitter of transistor Q1 through resistor R4, and the emitter of Q1 is also tied to a five volt source. The collector of Q1 is coupled through resistor R5 and zener diode D1 to ground. The inverted Q output of Z1 is coupled directly to the D input of Z1, to line L25, and also through resistor R6 and zener diode D1 to ground. Thus, the anode of zener diode D1 presents a buffered clock output at one-half the frequency of the crystal M1. The anode of zener diode Z1 is connected to the clock input of processor Z2.

In this particular embodiment of the invention, processor Z2 is an eight bit microprocessor sold commercially as the Z-80 by Zilog. The processor is coupled to thirteen address lines comprising address bus 14, as well as to eight bi-directional data lines comprising data bus 16. The BUSRQ and WAIT control inputs of the processor are tied through resistor R7 to a five volt source and are therefore held inactive. A variety of other control and interrupt lines are tied to other devices as will be detailed below. The address bus 14 and data bus 16 are coupled to read-only memory Z3. Additionally, read line L1 couples processor Z2 to read-only memory Z3. Z3 is a Type 2716 EPROM in this embodiment which stores 2048 bytes. Therefore, eleven bits of the address bus are coupled to Z3.

The data bus 16 is also coupled to random access memories Z4 and Z5. These devices are Type 5101 random access memories in this embodiment, with each device storing 256 groups of four bits. Thus, Z4 is coupled to the lower four bits of the data bus and Z5 is coupled to the upper four bits of the data bus in order to accomplish storage of eight-bit bytes. Z4 and Z5 are also coupled to read line L1 and write line L2 from processor Z2. Z4 and Z5 receive power from failure-protected power line L26.

Integrated circuit Z6 is an address decoder coupled to certain bits of the address bus 14. In this particular embodiment, Z6 is a Type 74S139 dual two-to-four decoder. Decoder 1 enables either the input/output interface Z16 through line L4 or the tone decoder Z8, each of which is described below. The two input lines of decoder 1 are coupled to bits 4 and 5 of the address bus. The enable input of decoder 1 is coupled through line L27 to the IOREQ output line of the processor Z2. The first output of the second decoder is coupled to the output enable input of read-only memory Z3. The third output bit of the second decoder is coupled to the chip enable inputs of random access memories Z4 and Z5. The fourth output bit of the second decoder is coupled through line L21 to the enable input of the SPC, which is described below. The two input bits of the second decoder are coupled to bits 11 and 12 of the address bus 14, and the enable input of the second decoder is coupled to the memory request output of processor Z2.

The tone decoder enable output of Z6 is connected to one input of NOR gate G4, and the other input of G4 is coupled to line L1. The output of G4 is coupled to line L3.

Figure 3:
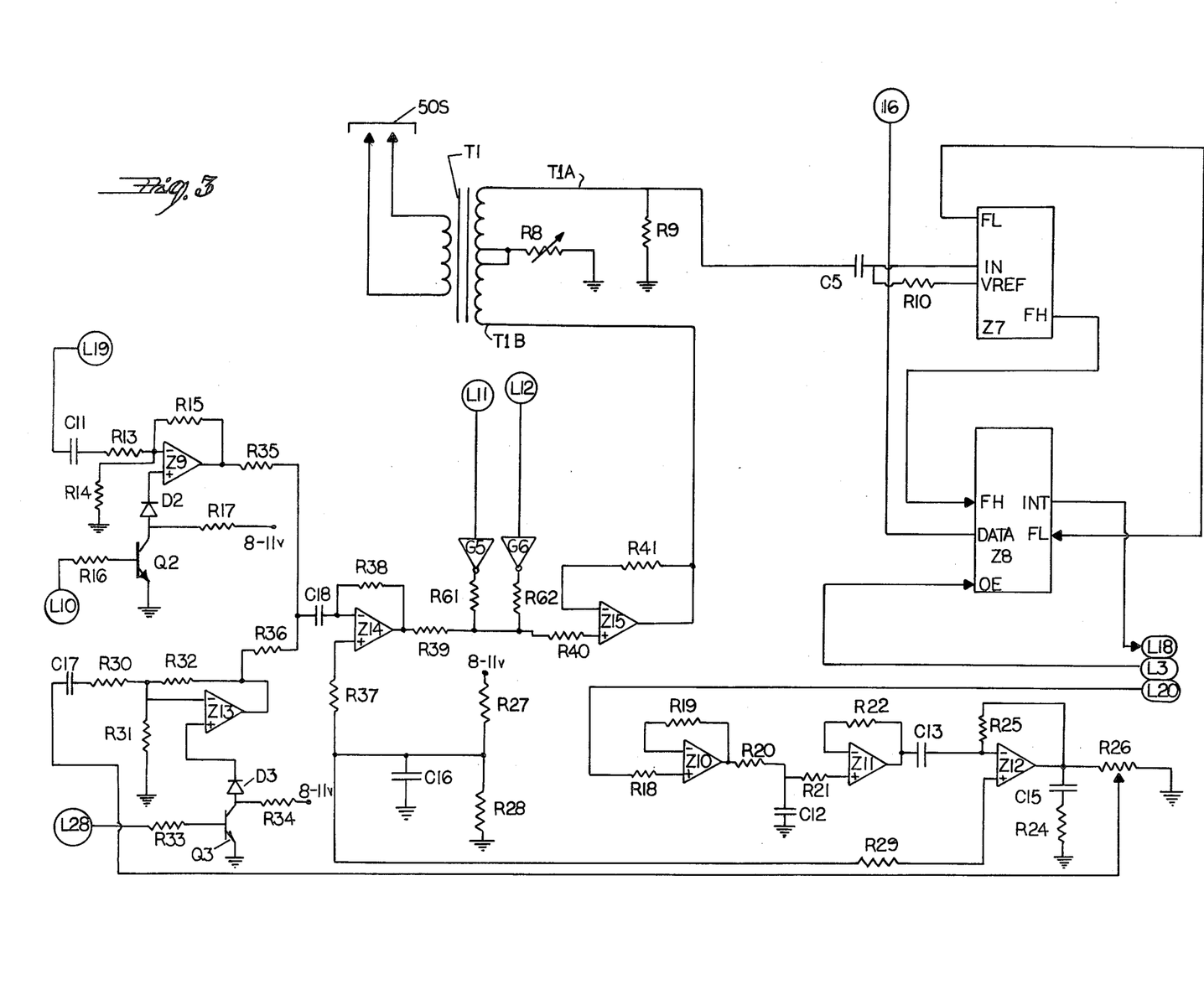
FIG. 3 is a circuit diagram of a circuit corresponding to the speech generator, output selector, gain control, tone decoder and isolation portions of the block diagram of FIG. 1.

Turning to FIG. 3, an isolation transformer T1 is illustrated with its primary taps coupled to the signal line pair 50S from channel 50. When the system 10 is coupled to a standard telephone channel, T1 may be a 600 ohm transformer. The center tap of the secondary winding of T1 is coupled through potentiometer R8 to ground and one secondary side tape T1A is coupled through capacitor C5 to the tone input of filter Z7, as well as through resistor R9 to ground. The voltage reference of Z7 is also coupled through resistor R10 to the tone input of Z7.

Since the standard pushbutton tone is a composite of two separate frequencies to designate a single button within a four by three array of buttons, Z7 is configured to separate the input tone from the channel into a high tone and a low tone. The low frequency and high frequency outputs of Z7 are coupled to the low frequency and high frequency inputs, respectively, of tone decoder Z8. Z8 is configured to translate the two tones received from channel 50 into four bits of data representing any of the numbers zero through eleven, corresponding to the pushbutton depressed by the user. Therefore, four bits of data bus 16 are coupled to the output bits of Z8. The interrupt output Z8 is coupled through line L18 to an input bit of input/output interface Z16, as is discussed below. The output enable input of Z8 is coupled to line L3.

The side tap T1B of transformer T1 is used to transmit synthetic speech or tuner audio output through channel 50 to the user. Tuner audio output line L19 is coupled through capacitor C11 and resistor R13 to the negative input of operational amplifier Z9, and the negative input of Z9 is also coupled through resistor R14 to ground as well as through resistor R15 to the output of Z9. The tuner enable line L10 is coupled through resistor R16 to the base of transistor Q2, and the emitter of transistor Q2 is grounded. The collector of Q2 is coupled through resistor R17 to a DC voltage source which may range between eight and eleven volts in this embodiment. The collector of Q2 is also coupled through diode D2 to the positive input of Z9.

Synthetic speech output line L20 is coupled through resistor R18 to the positive input of operational amplifier Z10. The negative input of Z10 is coupled through feedback resistor R19 to the output of Z10. The output of Z10 is also coupled through resistors R20 and R21 to the positive input of operational amplifier Z11, and resistor R20 and capacitor C12 in series to ground. The negative input of operational amplifier Z11 is coupled through feedback resistor R22 to the output of Z11. Z10 and Z11 and parts coupled therebetween comprise a low pass filter.

The output of Z11 is coupled through capacitor C13 to the negative input of operational amplifier Z12. The negative input of Z12 is also coupled through feedback resistor R25 to the output of Z12. The output of Z12 is also coupled through capacitor C15 and resistor R24 to ground as well as through potentiometer R26 to ground. A reference voltage is provided to the positive input of Z12. This reference voltage is provided by coupling resistor R27 to a voltage source which may range between eight and eleven volts in this embodiment. Resistor R27 is coupled through resistor R28 and capacitor C16 to ground and through resistor R29 to the positive input of Z12. The wiper of potentiometer R26 is coupled through capacitor C17 and resistor R30 to the negative input of operational amplifier Z13. The negative input of operational amplifier Z13 is also coupled through resistor R31 to ground as well as through resistor R32 to the output of Z13. The speech enable line L28 is coupled through resistor R33 to the base of transistor Q3, and the emitter of Q3 is grounded. The collector of Q3 is coupled through resistor R34 to a voltage source ranging between eight and eleven volts in this embodiment. The collector of Q3 is also coupled through diode D3 to the positive input of Z13. The outputs of Z9 and Z13 are coupled through resistors R35 and R36 respectively to capacitor C18, which is in turn coupled to the negative input of operational amplifier Z14. The positive input of Z14 is coupled through resistor R37 to resistor R27. The output of Z14 is coupled through resistor R38 to the negative input of Z14. The output of Z14 is also coupled through resistors R39 and R40 to the positive input of operational amplifier Z15. The negative input of Z15 is coupled through resistor R41 to the output of Z15, and the output of Z15 is also coupled to the tap T1B in order to provide either synthetic speech or tuner audio output through channel 50 to the user.

Lines L11 and L12 from Z16 are output volume control lines which are used to alter the audio level supplied by the system to channel 50. L11 is coupled through inverter G5 and resistor R61 to R40. Likewise, L12 is coupled through inverter G6 and resistor R62 to R40.

Figure 4:
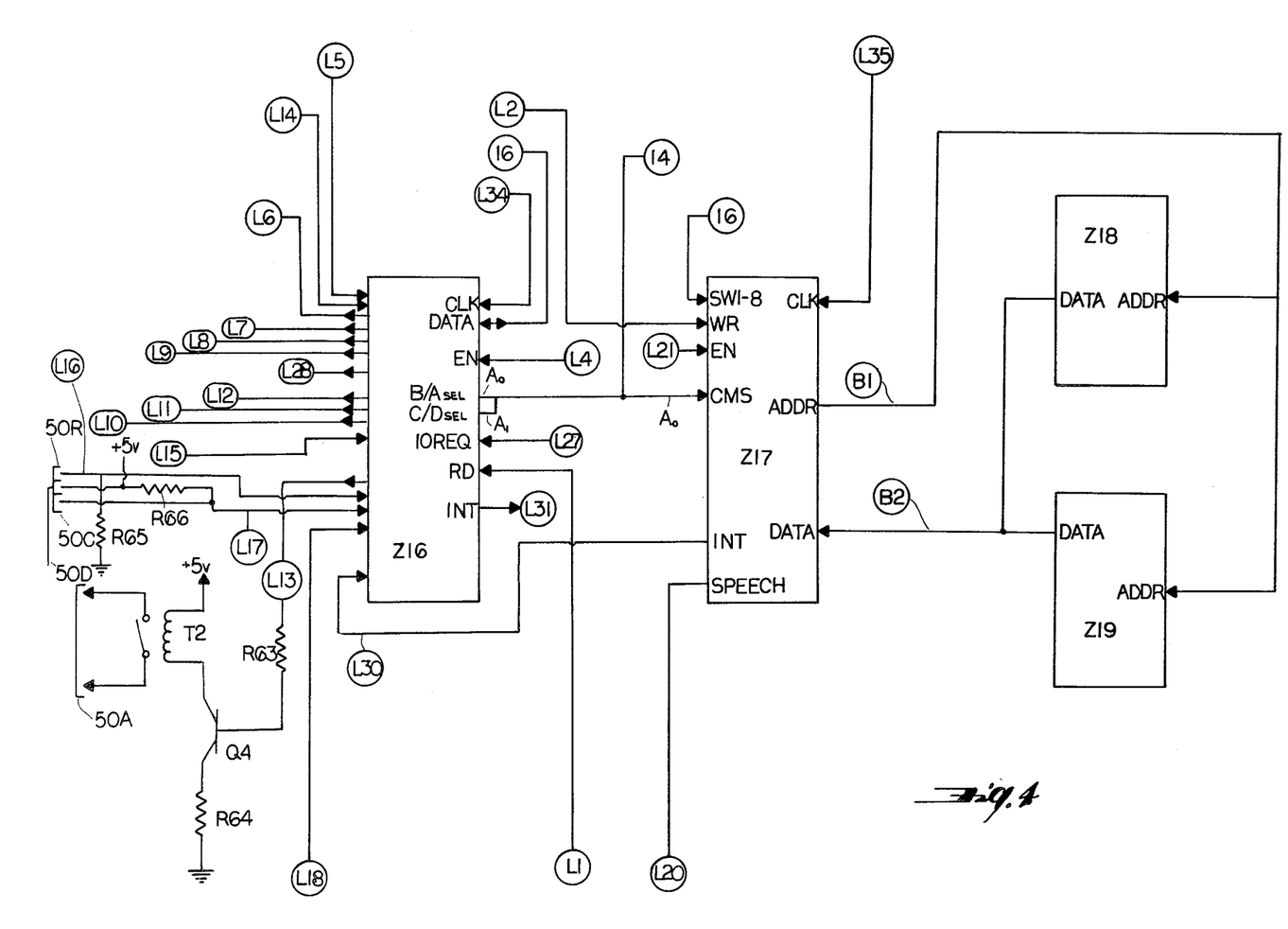
FIG. 4 is a circuit diagram of a circuit corresponding to the input/output interface and speech generator portions of the block diagram of FIG. 1.

Turning now to FIG. 4, integrated circuit Z16 is an output/input interface device, in this embodiment a parallel input/output circuit MK-3881 which is a well-known interface device designed for use with a Zilog Z80 processor. The clock input of Z16 is coupled to the line L34, and the eight di-directional data bits of Z16 are coupled to the data bus 16. The enable input of Z16 is coupled to line L4. The port select input is tied to address bus line $A_0$ and the data control select input is tied to address line $A_1$. The input/output request input is tied through line L27 to the corresponding output of processor Z2. The read input is tied directly to the read line L1. The interrupt output of Z16 is coupled through line L31 to the INT interrupt of processor Z2.

In this embodiment, the interface Z16 is configured so that of its eight bit ports are control ports with various individual bits serving as either input bits or output bits. In this particular embodiment, nine bits of the two ports are configured as output bits and are coupled to the following lines: system reset line L5, system shutdown line L6, AM/FM select line L7, tuner up line L8, tuner down line L9, tuner signal output select line L10, speech output select line L28, volume control lines L11 and L12, and answer ring control line L13. Another six bits are configured as input bits and are connected as follows: battery test input line L14, timer delay indicator L15, ring detector line L16, loop detector line L17, tone decoder ready line L18 and speech generator ready line L30.

Integrated circuit Z17 is a speech generator circuit, such as that sold by National Semiconductor under the designation SPC. The data bus 16 is coupled to the eight switch inputs of Z17, and the enable input of Z17 is coupled to line L21. The clock input of Z17 is connected to clock line L35. The write enable input of Z17 is coupled to the write line L2 from the processor Z2. The CMS input is coupled to address bus line $A_0$. The interrupt output of Z17 is coupled to line L30. The speech output of Z17 is coupled to line L20.

Z17 generates speech by interpretation of sequential phonetic information stored in read-only memories Z18 and Z19. These memories are preferably Type 52164 memories which hold 8,192 by eight bits. Information is provided from read-only memories Z18 and Z19 to Z17 through speech data bus B2, and Z17 demands specific data of memories Z18 and Z19 by way of speech address bus B1.

Line L13 is coupled through resistor R63 to the base of transistor Q4, and the emitter of Q4 is coupled through resistor R64 to ground. The collector of Q4 is coupled through the winding of relay T2 to a five volt source, and the switch contacts of T2 make or break the channel connect lines 50A.

Line L16 is coupled to channel ring line 50R, and through resistor R65 to ground. Line L17 is coupled to channel loop current line 50C and through resistor R64 to channel loop current line 50D which is tied to a a five volt source.

Figure 5:
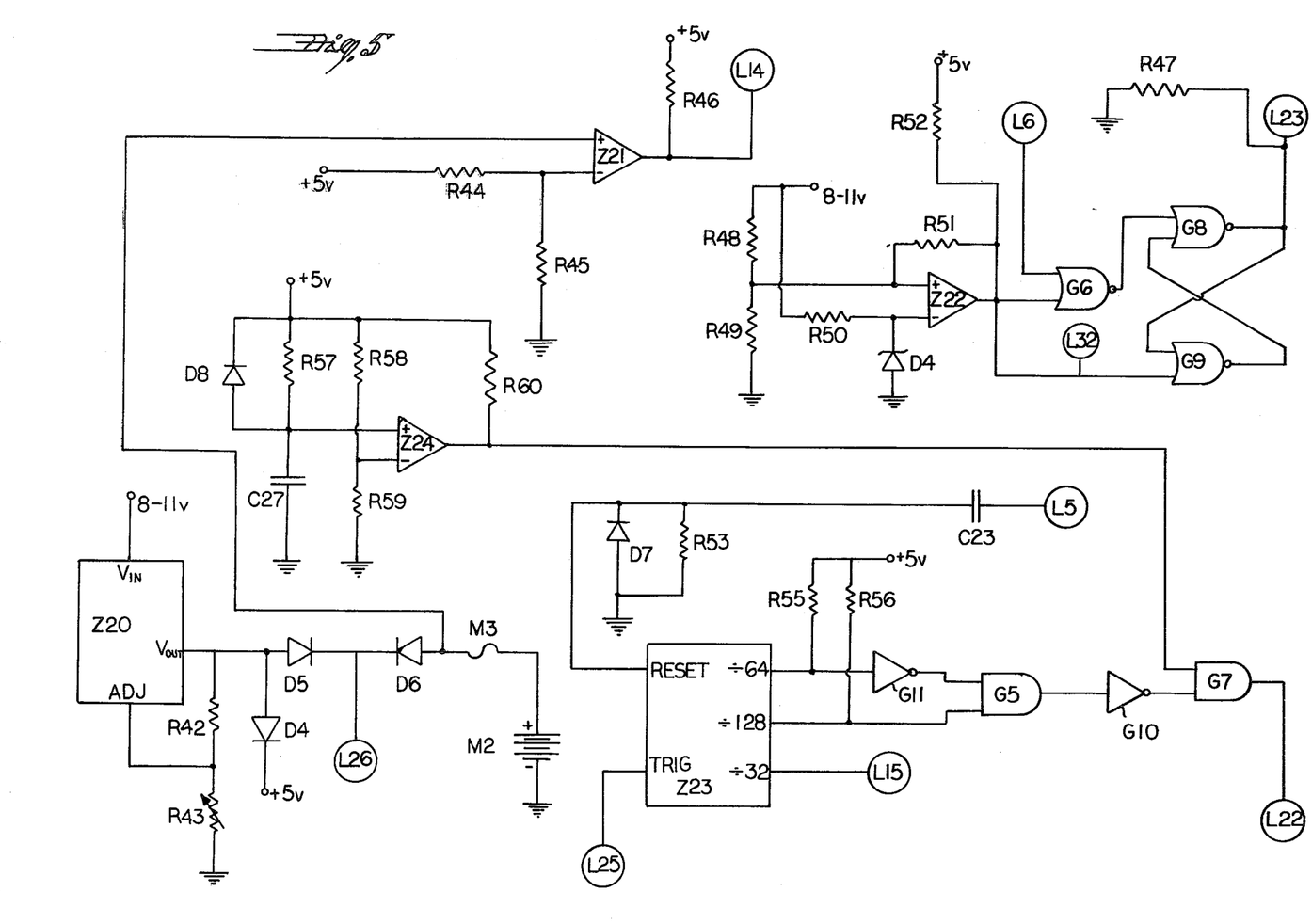
FIG. 5 is a circuit diagram of a circuit which provides auxiliary system condition monitoring and start-up functions for the circuits illustrated in FIGS. 2, 3 and 4.

Referring to FIG. 5, a voltage regulator Z20 accepts an input of eight to eleven volts and produces a regulated output of five volts for purposes of power supply and logic levels. The voltage out terminal of Z20 is coupled through resistor R42 and variable resistor R43 to ground, and through resistor R42 to the adjust input of Z20. The voltage out terminal is also coupled through diode D4 to supply five volts to the system. The voltage out terminal is further coupled through diode D5 to line L26, which supplies power to the random access memory circuits Z4 and Z5. A battery M2 is also coupled through a fuse M3 and diode D6 to line L26, in order to supply voltage to preserve the contents of Z5 and Z6 even when supply voltage to Z20 is lost. Battery M2 is also coupled through fuse M3 to the positive input of operational amplifier Z21. A five volt source is coupled through resistor R44 and R45 to ground, and through resistor R44 to the negative input of Z21. Z21 serves as a comparator of the battery voltage level and the output of Z21 is coupled to a five volt source through pullup resistor R46. The output of Z21 is also coupled to line L14 which supplies indication of the battery voltage status to an input bit of Z16.

Operational amplifier Z22 is utilized to monitor the level of supply voltage. The supply voltage ranging from eight to eleven volts is coupled through resistor R48 to the positive input of Z22, and through resistor R50 to the negative input of Z22. The positive input of Z22 is also coupled through resistor R49 to ground, and the negative input of Z22 is also coupled through zener diode D4 to ground. The output of Z22 is coupled through pullup resistor R52 to a five volt source, to line L32, and through feedback resistor R51 to the positive input of Z22. The output of Z22 is also coupled to one input of NOR gate G6, and the other input of G6 is coupled through line L6 to an output bit of Z16. Line 32 is coupled to the non-maskable interrupt of processor Z2.

NOR gates G8 and G9 are configured as a flipflop. The output of G8 is coupled to one input of G9 and the output of G9 is coupled to one input of G8. The second input of G8 is coupled to the output of G6, and the second input of G9 is coupled to the output of Z22. The output of G8 is also coupled through resistor R47 to ground, and to line L23 which is coupled to the micropower hold input of random access memories Z5 and Z6. When system shutdown occurs due to a loss of power or to program control, the output of G8 drops to logical low value which forces Z5 and Z6 into a micropower-hold mode in which 30 microamperes of power supply from battery M2 are drawn, and in which all addressing, read and write attempts are ignored by Z5 and Z6.

Line L5 from Z16 is coupled through capacitor C23 to the reset input of binary counter Z23. The reset input is also coupled through diode D7 and resistor R53 in parallel to ground. The inverted Q output of Z1 is coupled through line L25 to the count input of Z23. The divide by 64 and divide by 128 outputs of Z23 are tied through pullup resistors R55 and R56, respectively, to a five volt source. The divide by 128 output is connected to one input of AND gate G5, and the divide by 64 output is connected through inverter G11 to the other input of G5. The output of G5 is connected through inverter G10 to one input of AND gate G7. The divide by 32 output of Z23 is coupled through line L15 to an input of Z16.

Operational amplifier Z24 is configured to provide a low frequency pulse to the second input of G7. The positive input of Z24 is coupled to a five volt source through diode D8 and resistor R57 in parallel, and is also coupled through capacitor C27 to ground. The negative input of Z24 is coupled through resistor R59 to ground and through resistor R58 to a five volt source. The output of Z24 is coupled through pullup resistor R60 to a five volt source and is also coupled directly to the second input of G7.

The output of G7 is coupled to line L22 which is coupled to the reset input of processor Z2.

Commercially available tuners which may be interfaced with the system include the model R50U sold by Aiwa and the model T40P sold by JVC. Both models include tune up and tune down remote control inputs which may be coupled to lines L8 and L9, respectively, and may be easily modified to accommodate a connection with line L7 to select AM or FM reception bands.

A working embodiment of the system has been constructed utilizing the following component values. However, it should be understood that these values are presented for purposes of illustration only and are not intended to limit the present invention.

Resistors 2.2K: R1, R2, R61 and R62
500K: R57
825: R3
178: R4
50: R5
22: R6
10K: R7, R20, R66, R44, R46, R55, R56, R58 and R60
600: R9
2 M: R10
5 M: R11
1 M: R13, R14, R15, R18, R19, R21, R22, R30, R31, R32, R35, R36, R37, R38, R40 and R41
33K: R16, R27, R28 and R33
2K: R52
50K: R17, R34
330: R50
1K: R39, R65, R48 and R53
100K: R51
5K: R63
9.1K: R49
500: R64
15K: R45 and R59
240: R42

Capacitors 0.001 uF: C1
33 pF: C2
0.01 uF: C5, C11, C17 and C18
0.015 uF: C12
10 uF: C16
0.1 uF: C23
1 uF: C27

Diodes

1N4001: D2, D3, D4 and D7
1N459(SI): D5 and D6
1N4148: D8

Transistors

2N3904: Q2, Q3 and Q4
2N3406: Q1

Miscellaneous

TL2150-P, 3.4 V: M2
1/10 A fuse: M3
4.00 MHz crystal: M1

Integrated Circuits

74S74: Z1
Z80 MK-3880: Z2
2716: Z3
5101: Z4 and Z5
74S139: Z6
MT8865: Z7
MT8860: Z8
3900: Z9, Z10, Z11, Z12, Z13, Z14 and Z15
PIO MK-3881: Z16
SPC: Z17
MM52164: Z18 and Z19
LM317T: Z20
LM339: Z21, Z22 and Z24
ZR2240: Z23

In operation, the system 10 waits for detection of a channel connection request. When Z16 detects a ring on channel 50 through line L16, an interrupt signal is transmitted through line L31 to processor Z2. The processor Z2 then instructs Z16 to send current through line L13, thus forcing relay T2 to close the connection across the lines 50A, and to activate line L28 in order to connect the speech output of Z17 to the secondary winding tap T1B.

The processor Z2 then instructs the speech generator Z17 to transmit a series of phonemes informing the user of the menu function of system 10. As each phoneme is supplied to Z17, the processor Z2 then waits until Z17 signals through line L30 to input/output interface Z16 that phoneme transmission has been completed. Z16 then interrupts processor Z2 through line L31.

The system then waits for the user to transmit appropriate menu commands by pushbutton tone signals through lines 50S to filter Z7 and tone decoder Z8. Tone decoder Z8 signals through line L18 to input/output interface Z16 that a tone has been decoded, and Z16 again interrupts processor Z2.

Processor Z2 then reads data from tone decoder Z8. The process of waiting for a pushbutton tone and decoding and reading that tone may be repeated until a completed menu selection has been made. Typically, the user will have specified a frequency corresponding to a radio station within the market in which system 10 is located.

System 10 then responds to the user by repeating the menu selection through use of a speech generator Z17 as described above.

Following confirmation to the user, processor Z2 writes data to input/output interface Z16 which controls lines L7 and L8 or L9 to adjust tuner 30 to the appropriate frequency requested by the user, and activates line L10 in order to couple the audio output line L29 from tuner 30 to the secondary winding tap T1B. Thus, the user may monitor the broadcast transmissions of the station requested.

Processor Z2 thereafter waits until the user transmits a code indicating another menu selection or the user terminates the channel 50. If termination occurs, loop line L17 is activated which forces Z16 to interrupt processor Z2. If a menu selection is transmitted, tone decoder Z8 signals Z16 through line Z18, which likewise interrupts processor Z2. If channel 50 has been terminated, the processor Z2 writes data to Z16 which shuts off current to line L13 thereby forcing relay T2 to break the connection on lines 50A. The processor Z2 then waits for another connection request to be made.

If the user has transmitted tones requesting a volume increase, the processor Z2 may write data to input/output interface Z16 activating lines L11 or L12 in order to increase the output level to secondary winding tap T1B.

System 10 may also request the user to identify himself through a code number or password. For purposes of billing based on amount of use, the number of occasions and total length of time in which system 10 was used by each authorized user may be recorded in random access memories Z4 and Z5. The system may also break contact with unauthorized users. Further, the system 10 may provide a synthetic voice summary of stored usage data to a user supplying a system manager identification code. Random access memories Z4 and Z5 are provided with battery protected power supplies through line L26 so that usage data may be preserved in the event of line power outage. In the event that the voltage of battery M2 falls below a useful level, line L14 will be activated which forces Z16 to interrupt processor Z2. Thus the processor Z2 may take note of the battery power loss, and inform the system manager appropriately.

If the line supply voltage falls below a predetermined minimum level, operational amplifier Z22 interrupts processor Z2 through line Z32. Processor Z2 then writes data to input/output interface Z16 which activates line L6 forcing a shutdown. Line L23 is activated which forces random access memories Z4 and Z5 to a micropowerhold status as described above. Thus, data will be preserved until system 10 is again started. When power is again restored to the line voltage supply, operational amplifier Z24 and counter Z23 provide a reset signal to processor Z2 through line L22 after a delay which allows all components of system 10 to warm up.

The foregoing description has disclosed what is believed presently to be a preferred form of the present invention, and has been intended as an illustration of the principles of the present invention. Accordingly, other embodiments can be devised by those skilled in the art without departing from the spirit and scope of the following claims.

What is claimed is:

1. A remote tuner control system for responding to command signals generated by a user transmitted on a full-duplex communication channel comprising: tone decoder means coupled to said communication channel for conversion of pushbutton telephone tones generated by a user to binary numeric data; tuner means for reception of local audio broadcast radio signals; speech generator means for generating audio speech command menus and command acknowledgements; output selector means coupled to said tuner means and to said speech generator means for selection of audio information returned to the user; input/output interface means coupled to said tuner means and output selector means, said input/output interface means being adapted to control reception frequency of said tuner means and output selection of said output selector means; and processor means coupled to said input/output interface means, said speech generator means and said toner decoder means, said processor means being adapted to receive said binary numerical data from said tone decoder means and control said input/output interface means and said speech generator means in response to said binary numeric data from said tone decoder means.

2. The apparatus of claim 1 including isolation means, said isolation means coupling said full-duplex channel to said output selector means and to said tone decoder means.

3. The apparatus of claim 1 including ring detector means for detecting a user request to connect said channel to said system, and channel connection means for connecting said channel to said system, said ring detector means and said channel connection means being coupled to said input/output interface means.

4. The apparatus of claim 1 including a loop current detector means for detection of abnormal interruption of said channel, said loop current detector means being coupled to said input/output interface means.

5. The apparatus of claim 1 including gain control means, said gain control means being coupled to said output selector means for volume level control of audio information returned to the user, said gain control means being coupled to said input/output interface means for control by said input/output interface means.

6. The apparatus of claim 1 including read-only memory means and random access memory means coupled to said processor means.

7. The apparatus of claim 6 including battery means coupled to said random access memory means for supplying power to said random access memory means.

8. The apparatus of claim 6, including power supply fluctuation detector means, said power supply fluctuation detector means being coupled to said random access memory means to prevent loss of data in said random access memory means.

9. The apparatus of claim 6 including battery power loss detector means, said battery power loss detector means being coupled to said input/output interface means.

10. The apparatus of claim 1 wherein said processor is an eight-bit microprocessor.

11. A remote tuner control system for retransmission of broadcast radio audio material over a telephone line comprising: isolation means adapted to isolate said system from said telephone line; connection means adapted to selectively connect said telephone line to said isolation means; tone decoder means connected to said isolation means and adapted to decode standard telephone pushbutton signals; tuner means connected to said isolation means and adapted to retransmit broadcast radio audio signals; input/output interface means adapted to control said connection means and the reception frequency of said tuner means; and processor means connected to said input/output interface means and to said tone decoder means, said processor means being adapted to control said input/output interface means in response to data decoded by said tone decoder means.

12. The apparatus of claim 11 including speech generator means adapted to produce synthetic lingual audio material, said speech generator means being coupled to and controlled by said processor means; and an output selector means, said radio audio material and said lingual audio material being coupled to said output selector means, said output selector means being controlled by said input/output interface to select either said radio audio material or said lingual audio material to be connected to said isolation means.

13. The apparatus of claim 11 wherein said tuner includes an increase frequency input and a decrease frequency input, said increase frequency input and said decrease frequency input being coupled to said input/output interface.

14. The apparatus of claim 11 wherein said tuner means includes an AM/FM select input, said AM/FM select input being coupled to said output interface means.

15. A remote tuner control system for retransmission of broadcast radio audio material over a full-duplex communication channel comprising: tone decoder means connected to said channel and adapted to decode standard telephone pushbutton signals; speech generator means connected to said communication channel and adapted to transmit lingual audio material through said communication channel; tuner means connected to said channel and adapted to retransmit broadcast radio audio signals through said channel; and processor means connected to said tone decoder means, said tuner means and said speech generator means, said processor means being adapted to control said speech generator means and said tuner means in response to signals decoded by said tone decoder means.

* * * * *